(12) United States Patent
Jane

(10) Patent No.: US 7,748,915 B2
(45) Date of Patent: Jul. 6, 2010

(54) CAMERA MODULE AND METHOD FOR FORMING THE CAMERA MODULE

(75) Inventor: Shyan-Haur Jane, Tai-Tung Hsien (TW)

(73) Assignee: Lite-On Technology Corporation, Taipei (TW)

( * ) Notice: Subject to any disclaimer, the term of this patent is extended or adjusted under 35 U.S.C. 154(b) by 777 days.

(21) Appl. No.: 11/552,515

(22) Filed: Oct. 24, 2006

(65) Prior Publication Data
US 2007/0160369 A1    Jul. 12, 2007

(30) Foreign Application Priority Data
Jan. 10, 2006   (TW) .............................. 95100940 A

(51) Int. Cl.
G03B 17/02 (2006.01)
H04N 5/225 (2006.01)
(52) U.S. Cl. .................. 396/529; 250/239; 396/535; 348/373
(58) Field of Classification Search ............... 396/529, 396/532, 535, 541; 348/373, 374, 335, 340, 348/342; 250/239
See application file for complete search history.

(56) References Cited

U.S. PATENT DOCUMENTS

| | | | | |
|---|---|---|---|---|
| 7,494,292 B2 * | 2/2009 | Kong et al. | ................. | 396/529 |
| 2005/0219399 A1 * | 10/2005 | Sato et al. | .................... | 348/340 |
| 2006/0193064 A1 * | 8/2006 | Kim | ........................... | 359/811 |
| 2006/0228103 A1 * | 10/2006 | Go | ............................. | 396/268 |
| 2007/0030334 A1 * | 2/2007 | Nishizawa | .................. | 347/245 |
| 2007/0081092 A1 * | 4/2007 | Higuchi et al. | ............. | 348/335 |
| 2007/0272827 A1 * | 11/2007 | Heo et al. | ................ | 250/208.1 |

FOREIGN PATENT DOCUMENTS

WO    WO 2004107738 A1 * 12/2004

* cited by examiner

*Primary Examiner*—W. B. Perkey
*Assistant Examiner*—Dennis Hancock
(74) *Attorney, Agent, or Firm*—Rosenberg, Klein & Lee

(57) ABSTRACT

A camera module having an inner wall installed and a method for forming the camera module are disclosed. The camera module includes a lens; a sensor component for sensing light gathered by the lens; and a fixing module, for fixing the lens. The fixing module includes an inner wall that is installed on the sensing component. The inner wall of the fixing module protects a sensing region of an image sensor from unwanted matter resulting from manufacturing or from the outside environment.

11 Claims, 6 Drawing Sheets

CAMERA MODULE AND METHOD FOR FORMING THE CAMERA MODULE

BACKGROUND OF THE INVENTION

1. Field of the Invention

The present invention relates to a camera module and a method for forming the camera module, and more particularly, to a camera module having an inner wall installed and a method for forming the camera module.

2. Description of the Prior Art

Please refer to FIG. 1. FIG. 1 illustrates a section view of a conventional camera module 10. The camera module 10 is applicable in a compact camera module (CCM). The camera module 10 includes a lens 12, an image sensor 14, a fixing module 17, an IR filter 19, a circuit board 20 and a plurality of connecting wires (only two connecting wires 24, 28 are shown on FIG. 1). The lens 12 is utilized for gathering light, and the image sensor 14 installed on the circuit board 20 (such as a printed circuit board (PCB)), includes a sensing region 34 for sensing the light gathered by the lens 12. The fixing module 17 is installed on the circuit board 20 for fixing the lens 12. The IR filter 19 is utilized for filtering unwanted infrared light, and only light of desired wavelengths can pass through. Furthermore, as shown in FIG. 1, the IR filter 19 is coupled to the fixing module 17, and the IR filter 19, the fixing module 17 and the circuit board 20 are grouped to form a sealed space 11. The connecting wires 24, 28 are respectively connected to the image sensor 14 and the circuit board 20 for transmitting sensing signals outputted by the image sensor 14 to the circuit board 20, or for transmitting control signals outputted by the circuit board 20 to the image sensor 14. In the manufacturing process, the fixing module 17, the image sensor 14, the IR filter 19, the circuit board 20 and the connecting wires 24, 28 are combined to form a lens holder module, after that the lens 12 is placed onto the lens holder module.

In general, the conventional camera module 10 has the following disadvantages. First, the sensing region 34 may be affected by particles. More specifically, during the manufacturing process of the camera module 10, flux is utilized on some components such as soldering the connecting wires 24, 28 onto the circuit board 20, residue may remain around the connecting wires 24, 28 on the circuit board which cannot be cleaned. As a result, the residue remains in the sealed space 11, and as time passes, the residue may form into tiny particles, hence the sensing region 34 maybe affected by the particles in the sealed space 11, which affects the sensing quality.

A second disadvantage of the conventional camera module 10 involves reliability. The reliability of the sensing region 34 can be reduced due to moisture. Please refer to FIG. 2. FIG. 2 illustrates a top view of a bearing surface of a fixing module 17 and a circuit board 20, wherein a portion marked by oblique lines is the bearing surface. As illustrated in FIG. 1 and FIG. 2, the fixing module 17 supports the lens 12 and the IR filter 19, a surface area of a bearing surface which is a connected portion of the fixing module 17 and the circuit board 20 is very narrow, the width is usually only 0.4 mm. However, since the narrow bearing surface is required to support the weights of the lens 12, the IR filter 19 and the fixing module 17, therefore the connection portion of the fixing module 17 and the circuit board 20 may crack, causing instability in the structure of the camera module 10. Additionally, moisture can easily enter the sealed space 11 through the crack in the connection portion of the fixing module 17 and the circuit board 20, which affects the functions of the sensing region 14.

A third disadvantage is packaging yield. When the IR filter 19 is coupled to the fixing module 17, there is a possibility that air is disturbed and moved such that the particles near the sensing region 14 will fall onto the sensing region 14, which can cause the packaging yield to decrease; furthermore, when fixing the fixing module 17 on the circuit board 20, it is easy to compress the connecting wires 24, 28, which can also cause the packaging yield to decrease.

A fourth disadvantage is that the size of the lens is limited by the size of the fixing module, which does not always meet manufacturers' requirement to customize or redesign. After packaging the lens holder module (which includes the fixing module 17, the image sensor 14, the IR filter 19, the circuit board 20 and the connecting wires 24, 28), when the lens 12 is placed onto the lens holder module, the size of the lens is limited by the size of the fixing module 17, in another words, if the camera module 10 is to use a different sized lens, it is impossible to place the different sized lens directly onto the lens holder module without breaking the packaged lens holder module, thus the manufacturers' requirement for customization or redesigning cannot be met. This also indirectly increases the cost of manufacturing the camera module 10.

A fifth disadvantage is the limitation in the manufacturing material for the fixing module 17. In manufacturing the camera module 10, if a conventional hot bar process is required, as the circuit board 20 will directly pass heat to the fixing module 17, therefore the fixing module 17 is required to sustain high temperature, and only high temperature tolerant material can be utilized to prevent the fixing module 17 from deformation which can affect the fixation of the lens 12.

SUMMARY OF THE INVENTION

It is therefore one of the objectives of the claimed invention to provide a camera module and method of forming the camera module, to solve the above problems.

The claimed invention discloses a camera module comprising a lens; a sensor component for sensing light gathered by the lens; and a fixing module for fixing the lens, the fixing module comprising an inner wall installed on the sensor component.

The claimed invention further discloses a method for forming a camera module. The method comprises providing a fixing module comprising an inner wall; and utilizing the fixing module to fix a lens, and installing the inner wall on a sensor component.

The camera module of the claimed invention utilizes an inner wall of a fixing module to protect a sensing region of an image sensor from unwanted matter resulting from manufacturing or from the outside environment, such as tiny particles or moisture, such that the reliability of the sensing region and the packaging yield is increased; secondly, the camera module of the present invention has a molding material that fills between the inner wall, the image sensor and a circuit board, the molding material can protect the connecting wires from moving out of position caused by external force or vibration.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
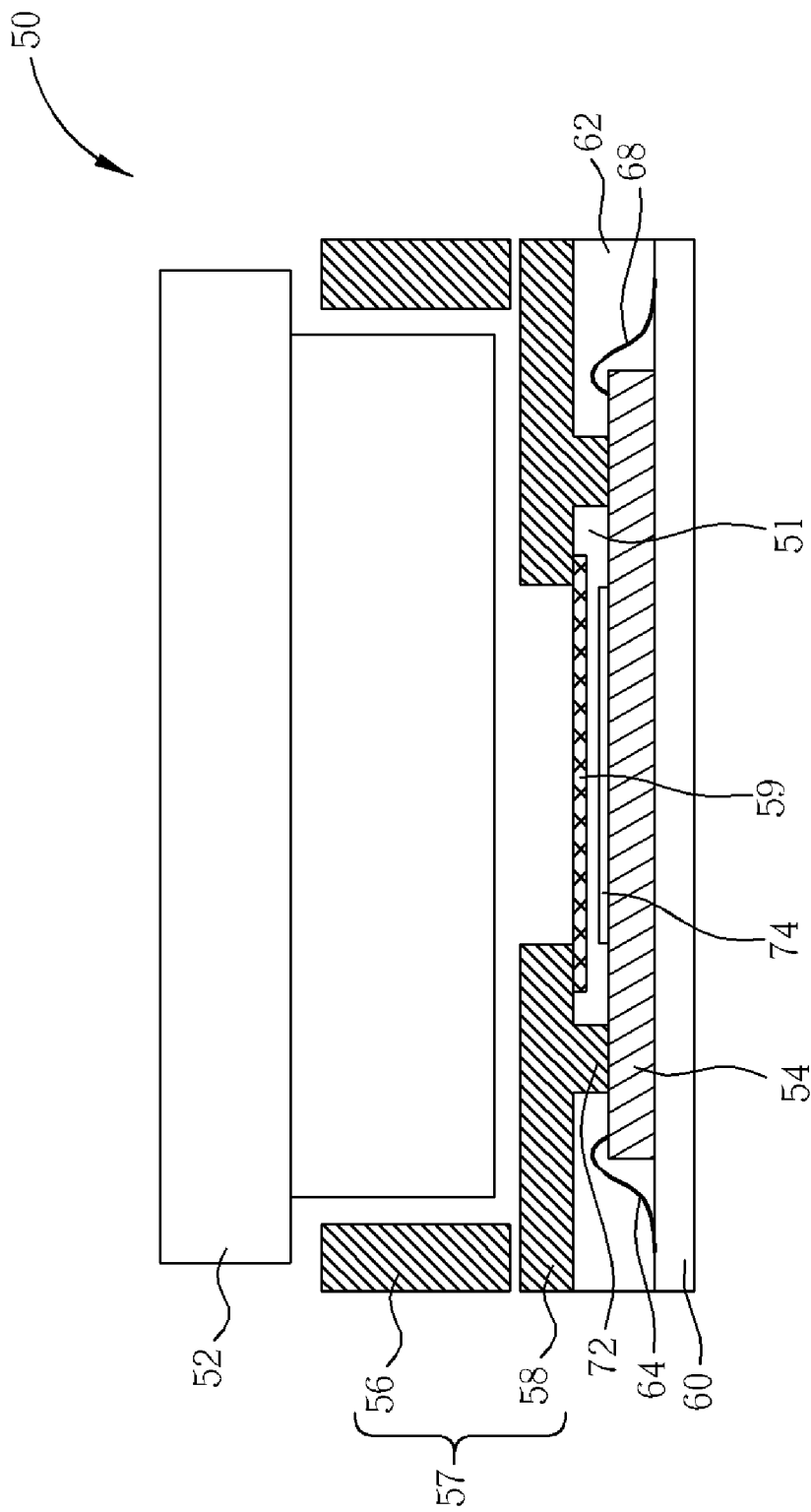
FIG. 3 illustrates a section view of a camera module according to an embodiment of the present invention.
Figure 4:
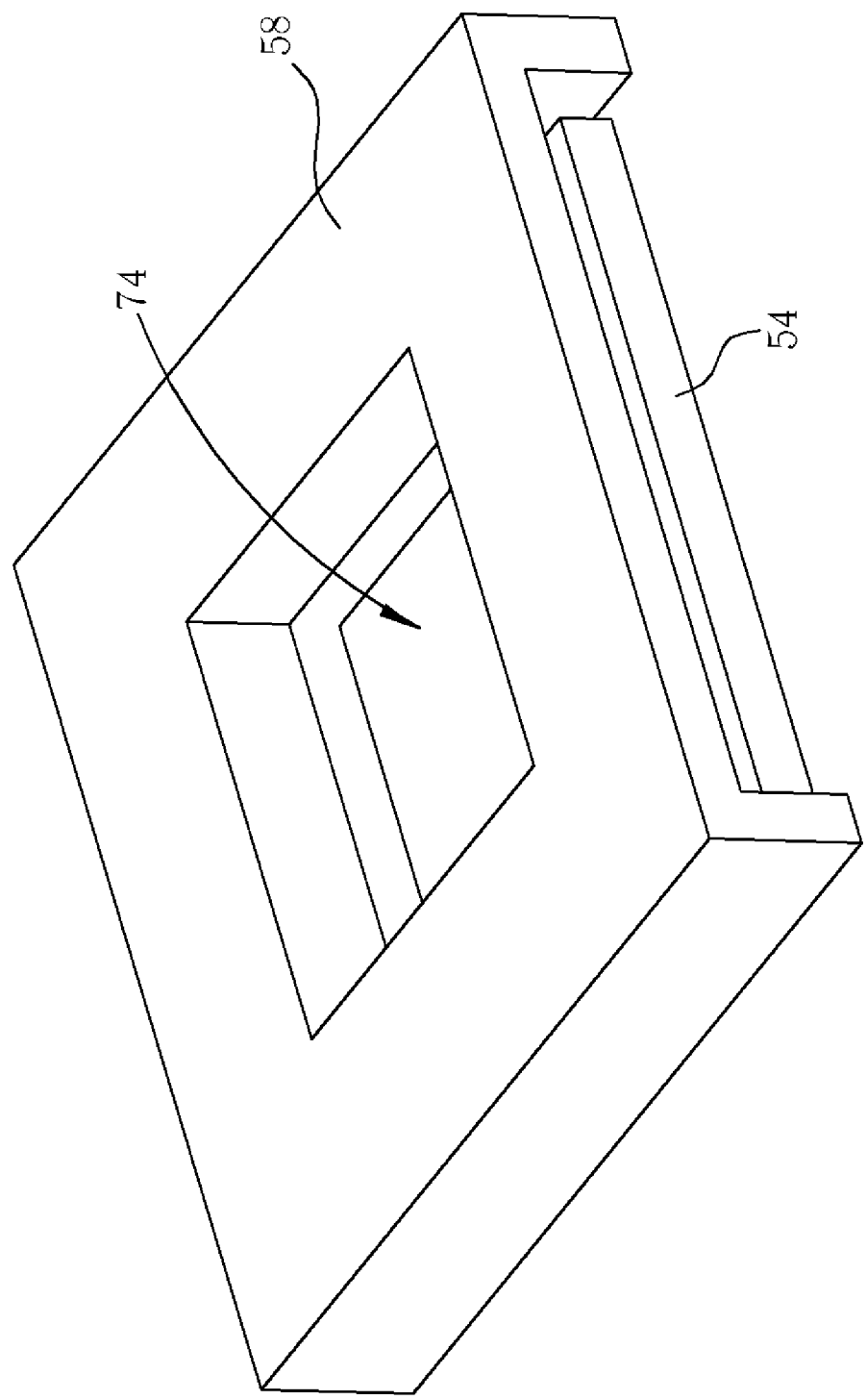
FIG. 4 illustrates a perspective view of a holder installed on an image sensor.
Figure 5:
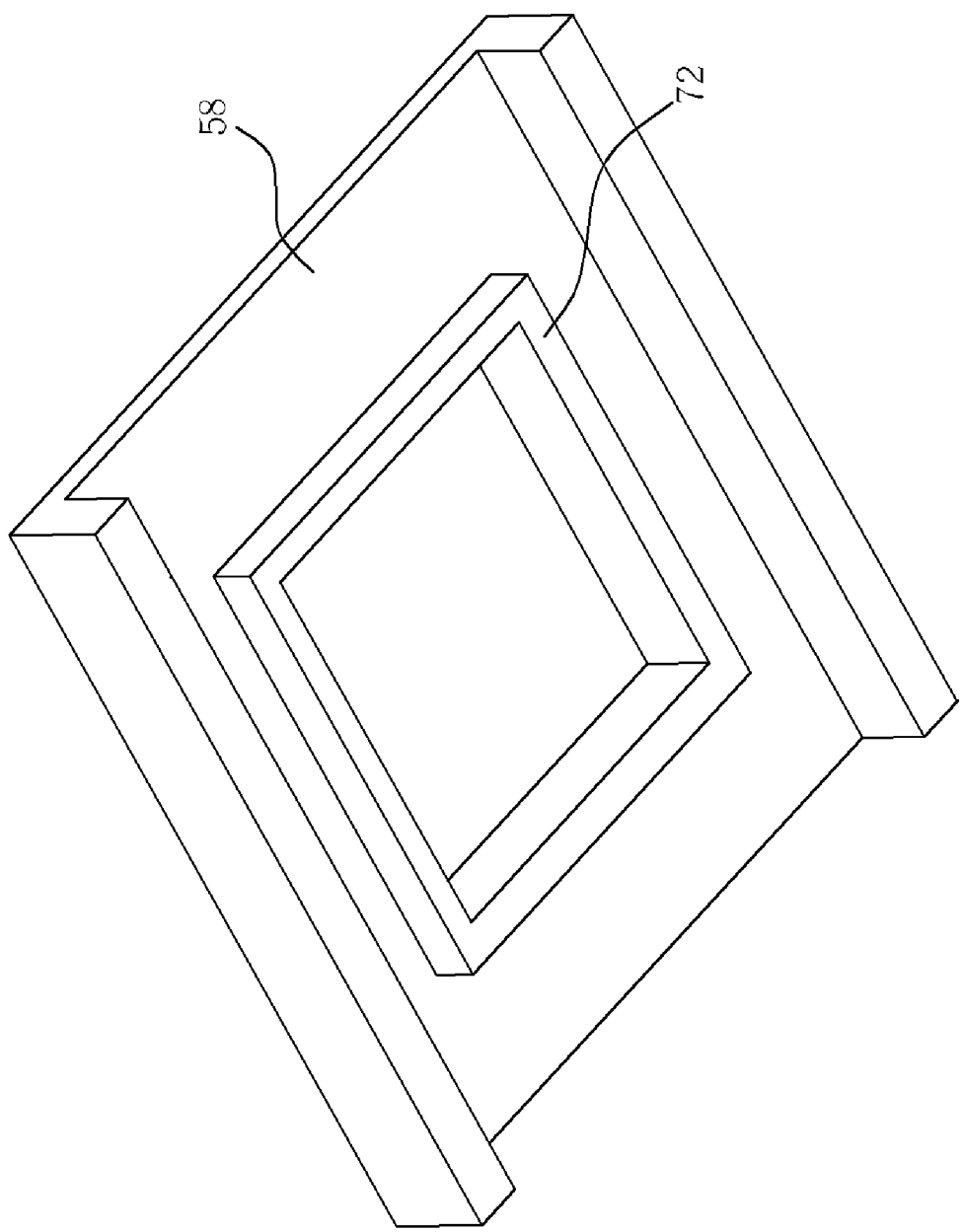
FIG. 5 illustrates a perspective view of a holder and an inner wall.

Please refer to FIG. 3. FIG. 3 illustrates a section view of a camera module 50 according to an embodiment of the present invention. The camera module 50 includes a lens 52, an image sensor 54, a fixing module 57, an IR filter 59, a circuit board 60, a molding material 62, and a plurality of connecting wires. Please note that there are only two connecting wires 64, 68 illustrated in FIG. 3 for simplicity. The functions of the lens 52 and the image sensor 54 are similar to the components in the prior art camera module 10. The image sensor 54 is installed on the circuit board 60, where the image sensor 54 includes a sensing region 74 for sensing light gathered by the lens 52. In an embodiment of the present invention, the circuit board 60 is a printed circuit board (PCB) or a flexible printed circuit. The fixing module 57 is utilized to fix the lens 52, in this embodiment, the fixing module 57 includes holders 56, 58, the holder 56 is utilized for fixing a position of the lens 52, and the holder 58 is coupled to the holder 56, furthermore as illustrated in FIG. 3, the holder 58 includes an inner wall 72, and in this embodiment the inner wall 72 encircles the sensing region 74 of the image sensor 54 and is installed on the image sensor 54 for supporting the holder 58, and the holder 56 and the lens 52 above the holder 58. Please refer to FIG. 4 through FIG. 5 to understand the relative position relationship between the holder 58, the inner wall 72 and the image sensor 54, and the sensing region 74. FIG. 4 illustrates a perspective view of the holder 58 installed on the image sensor 54. FIG. 5 illustrates a perspective view of the holder 58 and the inner wall 72.

The IR filter 59 is coupled to the holder 58 for providing a standard infrared filtering function for the image sensor 54, in another words to filter unwanted infrared rays and only light of desired wavelengths can pass through. The function is utilized for providing accurate visible light sensing window as unwanted noise is being filtered away. In FIG. 3, the IR filter 59, the inner wall 72 and the image sensor 54 form a sealed space 51. A plurality of connecting wires 64, 68 are respectively coupled to the image sensor 54 and the circuit board 60 for transmitting detection signals outputted by the image sensor 54 to the circuit board 60, or for transmitting control signals outputted by the circuit board 60 to the image sensor 54. In the manufacturing process of the camera module 50, a molding process is utilized, first the molding material 62 is filled between the inner wall 72, the image sensor 54 and the circuit board 60, the molding material 62 covers the connecting wires 64, 68 in order to fix the connecting wires 64, 68 and to protect the connecting wires 64, 68 from moving out of position caused by an external force or vibration. Furthermore, in this embodiment, the molding material 62 utilizes a heat insulating material to prevent heat transferring from the circuit board 60 to the fixing module 57 through the molding material 62, therefore a deformation of the fixing module 57 due to the heat can be prevented.

Please note that, the camera module 50 of the present invention is applicable in a compact camera module (CCM), thus in other embodiments, the camera module 50 of the present invention can also be applied in other fields. The image sensor 54 can be of other types of sensor components, and it is not limited by the metes and bounds of the present invention, and the IR filter 59 can also be of other types of filter components, and it is not limited by the metes and bounds of the present invention. The material of the connecting wires 64, 68 is usually metallic wire, but other material capable of transmitting signals can be utilized. Furthermore, in this embodiment, the holder 58, the image sensor 54, the IR filter 59, the circuit board 60, the molding material 62 and the connecting wires 64, 68 combine to form a lens holder module, then the size of the holder 56 is determined according to size of the lens 52. The holder 56 and the lens 52 are then placed on the lens holder module. However, in other embodiments, the fixing module 57 can also be made in a one-piece manufacturing process, however in this method, the size of the lens 52 cannot be altered after the lens holder module is formed, but the advantages of the inner wall are still retained.

In comparison to the prior art, the present invention includes the following advantages:

First, the present invention prevents particles from affecting the sensing region. The irremovable residue leftover is located outside the sealed space 51 when the connecting wires 64, 68 of the camera module 50 of the present invention are being soldered to the circuit board 60, therefore there is no matter in the sealed space, unlike the conventional camera module 10 where the residue is leftover on the connecting wires 26, 28 and within the sealed space 11. As for the camera module 50, the sensing region 74 is not affected by the tiny particles formed by the leftover residue.

Figure 2:
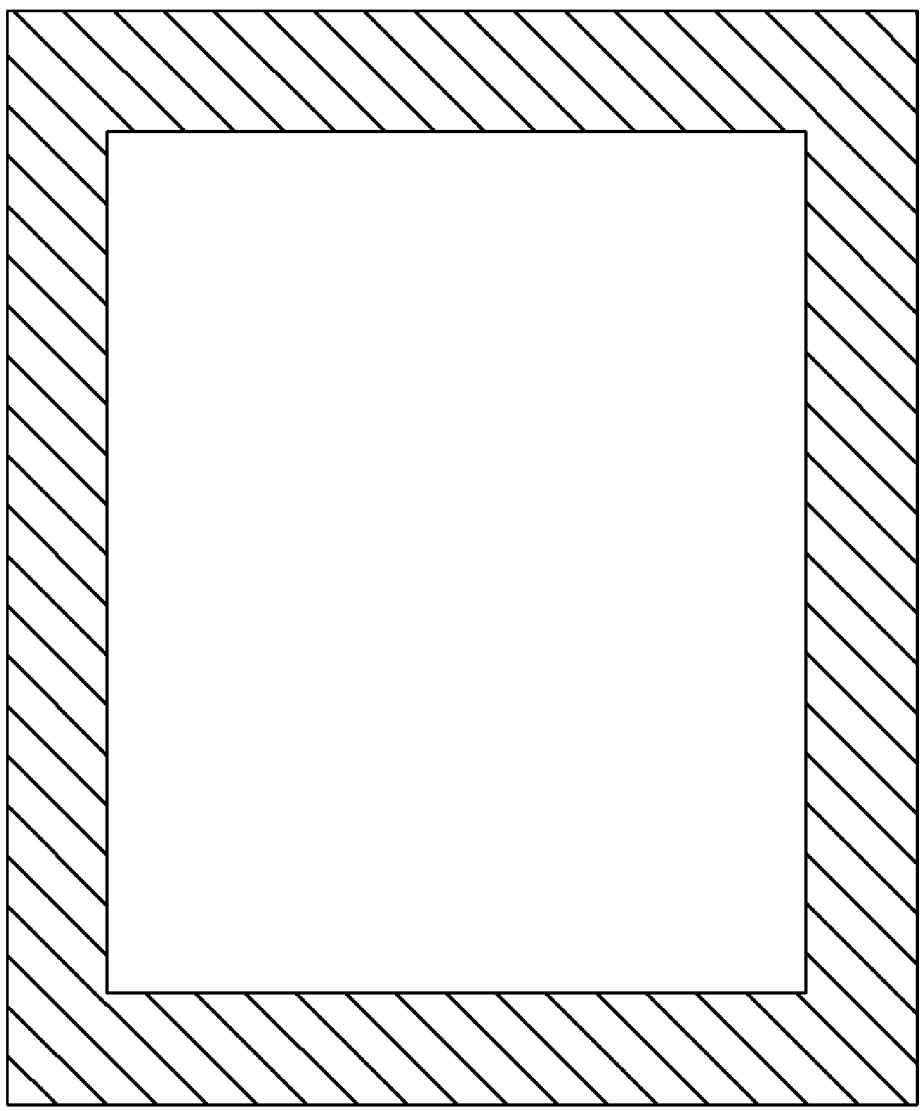
FIG. 2 illustrates a top view of a bearing surface of a fixing module and a circuit board.
Figure 6:
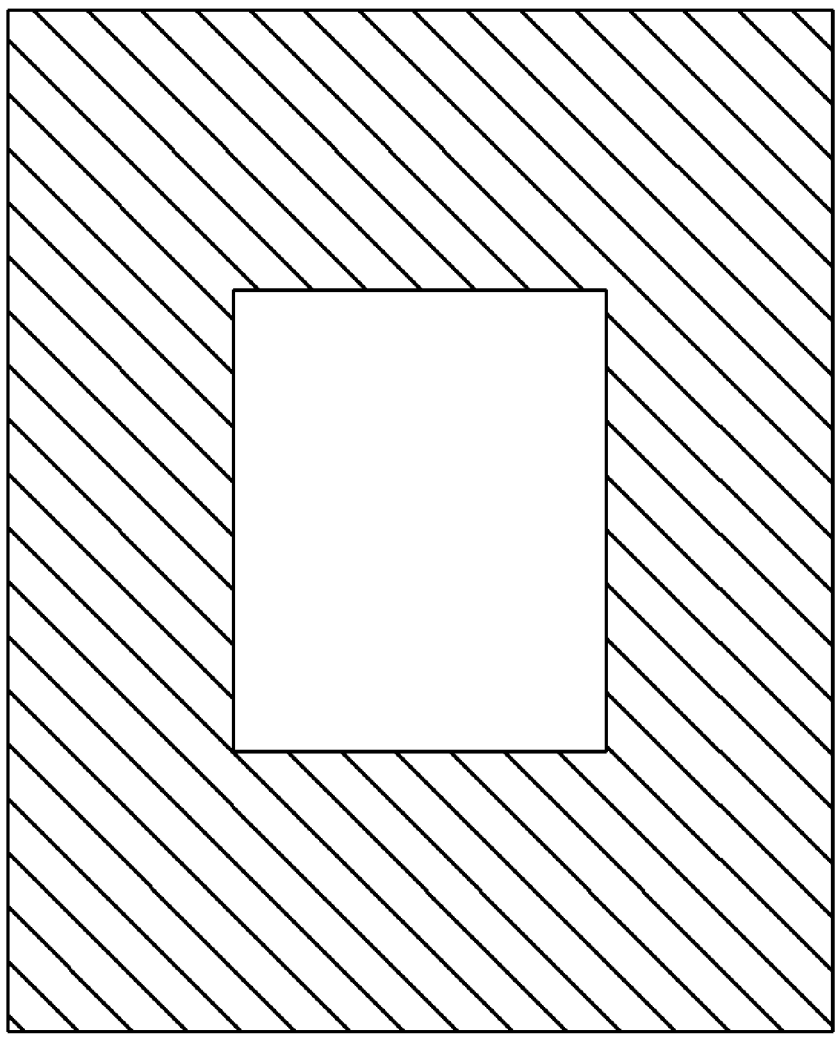
FIG. 6 illustrates a top view of a bearing surface between a molding material and a circuit board.

Second, the present invention provides a quarantine mechanism for the sensing region to improve the reliability of the sensing region. As illustrated in FIG. 3, the lens 52 and the IR filter 59 are supported by the fixing module 57 and the molding material 62. At the same time please refer to FIG. 2 and FIG. 6. FIG. 6 illustrates a top view of a bearing surface between the molding material 62 and the circuit board 60, wherein a portion marked by oblique lines is the bearing surface, the bearing surface here is greater than the bearing surface of the conventional camera module 10, therefore the architecture and construction of the camera module 50 has greater stability. Furthermore, as the molding material 62 fills between the inner wall 72, the image sensor 54 and the circuit board 60, it is difficult for moisture outside the camera module 50 to enter the sealed space 51. Thus the probability of moisture entering the sensing region 74 is greatly reduced.

Third, the present invention packaging yield is better. As previously mentioned in the first point, the inner wall 72 blocks the tiny particles, therefore when the IR filter 59 is coupled to the holder 58 of the fixing module 57, the sensing region 74 is not affected by the tiny particles, hence the packaging yield is better; furthermore, as the holder 58 is fixed on the image sensor 54, as illustrates in FIG. 3, the holder 58 will not press the connecting wires 64, 68, which results in a better packaging yield.

Fourth, the present invention size of the lens is not limited by the size of the fixing module and thereby better meets manufacturers' requirement to customize or redesign. After packaging the lens holder module, then the size of the holder 56 is selected according to the size of the lens 52. The holder 56 is then placed in the lens holder module, and lastly the lens 52 is placed on the holder 56; furthermore, if a new lens is to replace the original lens 52, in the manufacturing process of the camera module, the size of a new holder can be dynamically selected according to the size of the new lens, therefore a great degree of freedom in the selection of the size of the lens 52 in the camera module 52, hence the manufacturers' requirement for customization or redesigning can be met, which also directly reduces the cost of manufacturing the camera module 50.

Fifth, the present invention manufacturing material for the fixing module 17 is less limited. As the fixing module 57 of the present invention is not directly installed on the circuit board 60 (but the fixing module 57 is installed on the image sensor 54, as illustrated in FIG. 3), and the molding material 62 is a heat insulated material, therefore if the conventional heat bar manufacturing process is performed, heat will not pass from the circuit board 60 or the molding material 62 to the fixing module 57, therefore material temperature tolerant for the fixing module 17 can greatly reduce, and even though the material of the fixing module 57 is not high temperature tolerant, the fixing module 57 will not deform and the fixation of the lens 52 is not affected.

Sixth, in the present invention light is effectively blocked. The inner wall 72 encircling the sensing region 74 of the image sensor 54 is installed, this helps to block out unwanted light into the sensing region 74.

Figure 1:
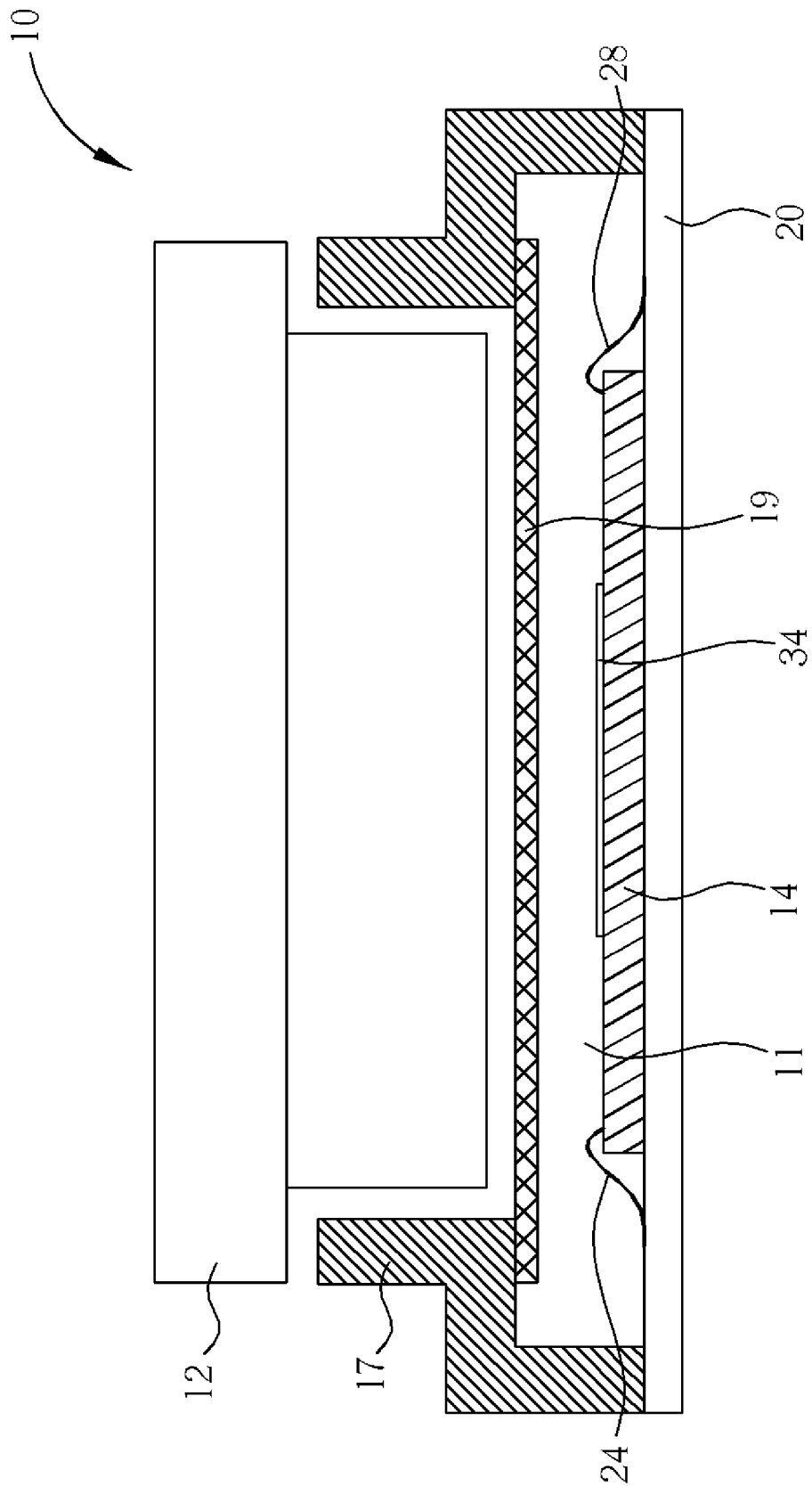
FIG. 1 illustrates a section view of a conventional camera module.

Seventh, in the present invention the size of the surface area required by the camera module is reduced. If the size of the lens 52 and the lens 12 are equal, as width of the fixing module 57 is equal to width of the lens 52, as illustrated in FIG. 1 and FIG. 3, width of the fixing module 57 is less than width of the conventional fixing module 17, hence space can be saved to achieve an objective of minimizing the camera module 50.

In comparison to the prior art, the camera module of the present invention utilizes an inner wall of a fixing module to protect a sensing region of an image sensor from unwanted matter resulting from manufacturing or from the outside environment, such as tiny particles or moisture, such that the reliability of the sensing region and the packaging yield is increased; secondly, the camera module of the present invention has a molding material that fills between the inner wall, the image sensor and a circuit board, the molding material can protect the connecting wires from moving out of position caused by external force or vibration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A camera module, comprising:
a lens;
a sensor component for sensing light gathered by the lens;
a fixing module, comprising a first holder for fixing the lens, and a second holder coupled to extend from the first holder, the second holder comprising an inner wall installed on the sensor component;
a filter component, coupled to the second holder, wherein the filter component, the inner wall and the sensor component form a sealed space;
a circuit board, the sensor component being installed on the circuit board; and
a molding material, filling between the inner wall, the sensor component, and the circuit board.

2. The camera module of claim 1 further comprising:
a connecting wire coupled to the sensor component and the circuit board for transmitting signals outputted by the sensor component to the circuit board, or for transmitting signals outputted by the circuit board to the sensor component;
wherein the molding material covers the connecting wire to fix the connecting wire.

3. The camera module of claim 1 wherein the molding material is a heat insulating material.

4. The camera module of claim 1 wherein the inner wall encircles a sensing region of the sensor component, where the sensing region is utilized for sensing light gathered by the lens.

5. A method for forming a camera module, comprising:
providing a fixing module, the fixing module comprising a first holder and a second holder, the second holder comprising an inner wall;
utilizing the first holder to fix a lens, and installing the inner wall on a sensor component;
coupling the second holder to extend from the first holder;
providing a filter component, and coupling the filter component to the second holder so that the filter component, the inner wall and the sensor component form a sealed space;
providing a circuit board, and installing the sensor component on the circuit board; and
providing a molding material, and filling the molding material between the inner wall, the sensor component, and the circuit board.

6. The method of claim 5 further comprising:
providing a connecting wire, and coupling the connecting wire to the sensor component and the circuit board to transmit signals outputted by the sensor component to the circuit board, or to transmit signals outputted by the circuit board to the sensor component;
wherein the step of filling the molding material between the inner wall, the sensor component and the circuit board further comprises: utilizing the molding material to cover the connecting wire to fix the connecting wire.

7. The method of claim 5 wherein the molding material is a heat insulating material.

8. The method of claim 5 wherein the inner wall encircles a sensing region of the sensor component, where the sensing region is utilized for sensing light gathered by the lens.

9. The method of claim 5 further comprising:
dynamically determining a size of the first holder according to a size of the lens.

10. A camera module, comprising:
a circuit board;
a sensor component installed on the circuit board;
a plurality of connecting wires, electrically connected to the circuit board and the sensor component;
a fixing module, comprising a first holder for fixing the lens, and a second holder coupled to extend from the first holder, the second holder comprising an inner wall installed on the sensor component;
a filter component, coupled to the second holder, wherein the filter component, the inner wall and the sensor component form a sealed space; and
a molding material, filling between the inner wall, the sensor component, and the circuit board.

11. The camera module of claim 10 further comprising a molding material located on the circuit board for covering the plurality of connecting wires.

* * * * *